US010490234B2

(12) United States Patent
Sheldon et al.

(10) Patent No.: US 10,490,234 B2
(45) Date of Patent: Nov. 26, 2019

(54) RECOVERING FROM DATA ACCESS ERRORS BY CONTROLLING ACCESS TO NEIGHBORING MEMORY UNITS

(71) Applicant: Seagate Technology LLC, Cupertino, CA (US)

(72) Inventors: Jay Allen Sheldon, Shakopee, MN (US); Ryan James Goss, Prior Lake, MN (US)

(73) Assignee: Seagate Technology LLC, Cupertino, CA (US)

( * ) Notice: Subject to any disclaimer, the term of this patent is extended or adjusted under 35 U.S.C. 154(b) by 105 days.

(21) Appl. No.: 15/785,577

(22) Filed: Oct. 17, 2017

(65) Prior Publication Data

US 2018/0107568 A1 Apr. 19, 2018

Related U.S. Application Data

(60) Provisional application No. 62/408,886, filed on Oct. 17, 2016.

(51) Int. Cl.

| | |
|---|---|
| ***G11C 7/04*** | (2006.01) |
| ***G06F 3/06*** | (2006.01) |
| *G06F 11/07* | (2006.01) |

(52) U.S. Cl.

CPC ................ *G11C 7/04* (2013.01); *G06F 3/064* (2013.01); *G06F 3/0619* (2013.01); *G06F 3/0679* (2013.01); *G06F 11/0727* (2013.01); *G06F 11/0751* (2013.01)

(58) Field of Classification Search

CPC ............... G06F 11/0727; G06F 11/073; G06F 11/3058; G11C 7/04; G11C 29/08

See application file for complete search history.

(56) References Cited

U.S. PATENT DOCUMENTS

| | | | | |
|---|---|---|---|---|
| 7,426,649 | B2 * | 9/2008 | Brittain | G11C 5/143 711/100 |
| 8,213,255 | B2 * | 7/2012 | Hemink | G11C 7/04 365/211 |
| 8,717,840 | B2 * | 5/2014 | Higashi | G11C 7/00 365/185.11 |
| 2005/0270842 | A1 | 12/2005 | Furuta et al. | |
| 2010/0025811 | A1 | 2/2010 | Bronner et al. | |
| 2010/0064096 | A1 | 3/2010 | Weingarten et al. | |
| 2010/0306583 | A1 | 12/2010 | Kim et al. | |
| 2011/0289349 | A1 | 11/2011 | Loeser et al. | |
| 2014/0347936 | A1 | 11/2014 | Ghaly | |
| 2014/0369110 | A1 * | 12/2014 | Cho | G11C 7/04 365/149 |

* cited by examiner

*Primary Examiner* — Joseph R Kudirka

(74) *Attorney, Agent, or Firm* — Mueting, Raasch & Gebhardt, P.A.

(57) ABSTRACT

An unrecoverable error is determined when attempting to access data stored in a target memory unit of a storage medium of a data storage device. Access to neighboring memory units that are proximate to the target memory unit is controlled in response. The controlling of the access affects a temperature of the target memory unit over a period of time. After the period of time, access to the data is attempted from the target memory unit.

20 Claims, 7 Drawing Sheets

RECOVERING FROM DATA ACCESS ERRORS BY CONTROLLING ACCESS TO NEIGHBORING MEMORY UNITS

RELATED PATENT DOCUMENTS

This application claims the benefit of Provisional Patent Application No. 62/408,886 filed on Oct. 17, 2016, which is incorporated herein by reference in its entirety.

SUMMARY

The present disclosure is directed to recovering from data access errors by controlling access to neighboring memory units. In one embodiment, an unrecoverable error is determined when attempting to access data stored in a target memory unit of a storage medium of a data storage device. Access to neighboring memory units that are proximate to the target memory unit is controlled in response. The controlling of the access affects a temperature of the target memory unit over a period of time. After the period of time, access to the data is attempted from the target memory unit.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

Figure 1:
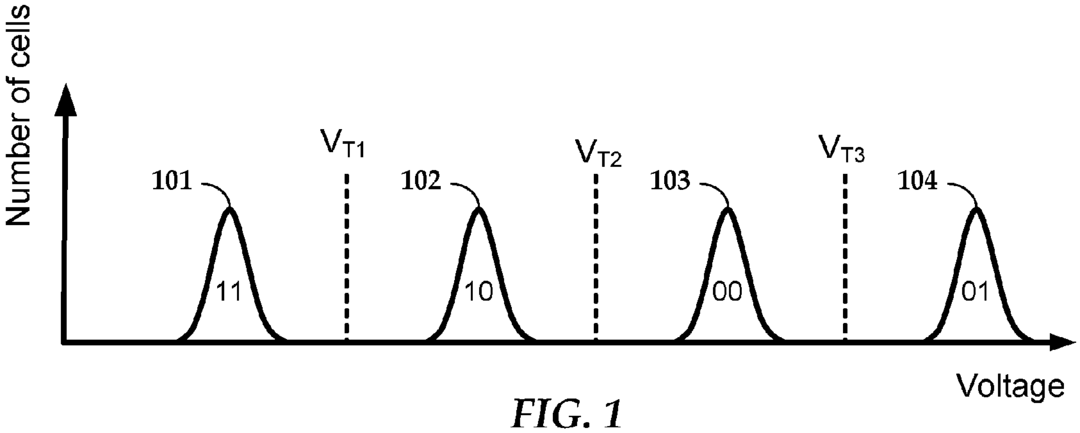
FIGS. 1 and 2 are diagrams illustrating errors in a data storage media according to an example embodiment.

The present disclosure generally relates to data storage devices that utilize nonvolatile, solid-state memory storage media, e.g., flash memory. Non-volatile memory devices are capable of retaining stored data for relatively long periods of time on the order of years, even to the absence of external power. Non-volatile, solid-state memory includes flash memory that programs data into memory cells by applying a voltage causing a charge to be stored on a floating gate of a transistor. The data can be read later from the memory cell by sensing the voltage of the transistor and comparing the sensed voltage to a read reference voltage (also referred to as a threshold voltage). Flash memory technologies include NOR flash, NAND flash, 2D NAND flash, 3D NAND flash (also called NAND (VNAND)), and various other technologies known to the industry. The embodiments described herein may also be applicable to some magnetic disk storage systems and volatile memory technologies.

Memory cells are known to exhibit errors caused, for example, by charge leakage, manufacturing defects, and disturb effects. These errors may be manifested as bit errors in the decoded data. A memory device may use a number of measures to account for these errors, such as error correction codes (ECC) that utilize extra data for detecting and correcting bit errors. The memory device may generate a bit error rate (BER) signal based on ECC activity and can use BER to analyze system performance.

Non-volatile memory devices may include single level cells (SLCs) that store one bit of data per cell or may include multi-level cells (MLCs) that can be programmed to store two or more bits of information. Reading data stored in SLCs involves distinguishing between two possible voltage levels. Reading data stored in MLCs involves distinguishing between more than two possible voltage levels. In general, a memory cell may be programmed to a predetermined number of threshold voltage (VT) values.

Memory cells can be arranged in dies, blocks, and pages. A die comprises a semiconductor "chip" upon which memory cells are fabricated. The memory cells of a memory device can also be grouped into data units referred to herein as blocks that have a virtual presence and rarely a physical presence. A block can correspond, for example, to a block of memory cells that are read at substantially the same time. A block can also correspond to a block of memory pages that are erased at substantially the same time may be referred to as a block or erasure unit. A block is the smallest addressable unit or block of memory cells for erase operations, typically consisting of multiple pages. Memory cells are programmed in units of pages and the pages are not re-programmed, once programmed, until after the block of pages is erased. Garbage collection operations can be performed on the blocks of pages, wherein the blocks are erased after active data stored in each block is moved to another location. Thus, each memory cell of the memory device undergoes numerous program/erase (PE) cycles during the lifetime of the memory cell. In floating gate transistor memory cells, each PE cycle can degrade the cell, and after many PE cycles, lead to a decreased ability of the cell to retain data without substantial charge leakage.

Volatile memory such as dynamic random access memory (DRAM) utilizes capacitive cells that store a charge that can represent the state of a bit. Unlike non-volatile memory, the charge will leak away over time, and so the cells are refreshed periodically. Other types of volatile memory such as static RAM use flip-flops to store bits of data. This prevents the need to continually refresh the memory, although data will be eventually be lost once power is removed. In either case, the cells of volatile memory can degrade over time similarly to non-volatile memory.

Some errors experienced by memory cells are caused by progressive degeneration or damage that occurs with increased use. Embodiments described herein provide approaches for recovering from read errors of volatile or non-volatile, solid state memory cells. For example, in cases where decreasing temperature will aid recovery, access to cells to near the affected cell is restricted allowing heat in the affected cell to dissipate. In cases where increasing temperature will aid recovery, access to cells near the affected cell is forced (e.g., by reads or erases) allowing heat in the affected cell to build.

Figure 2:
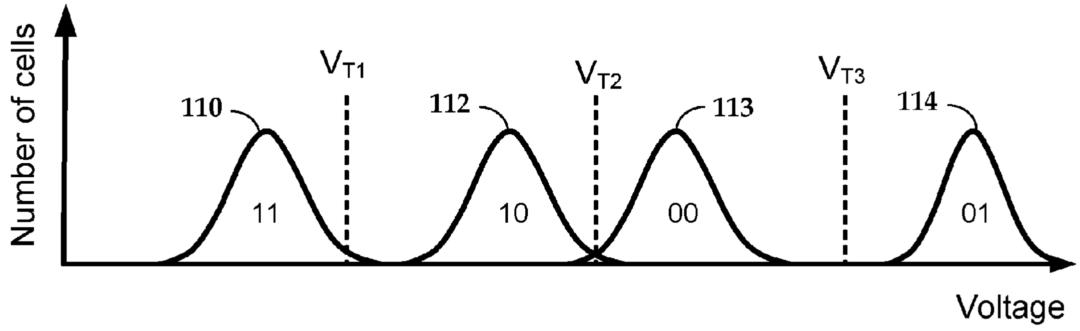

In reference now to FIGS. 1 and 2, diagrams illustrate graphically how data is initially stored in a two-bit per cell non-volatile memory device (FIG. 1) and can change with use (FIG. 2). An example of how data is stored in a two-bit MLC device is shown in FIG. 1. The digital states/symbols 11, 10, 00, and 01 associated with read voltage distributions 101-104, respectively. Voltages VT1, VT2, and VT3 are threshold voltages that serve as boundaries between each of states/symbols. When new, the two-bit memory device typically has all data for a specific state/symbol for a block or page of memory cells at theoretically the same read voltage or, in practice, within a narrow spread of read voltages shown as by distributions 101, 102, 103, 104. Thus, after programming, a value of 00 in a cell, all cells in a specified block (or other group of memory) with values of 00 should exhibit a read voltage that falls somewhere in narrow distribution 103 that is substantially distant from the boundary threshold voltages VT2, and VT3.

It should be noted that in an arrangement such as shown in FIG. 1, the two bits in each cell need not be associated with the same word or page. For example, a memory system may be arranged so that the left most bit (most significant bit or MSB) is associated with one word or page and the right most bit (least significant bit or LSB) is associated with another word or page.

The diagram in FIG. 2 shows the distributions of the voltages of the cells of FIG. 1 after a large number of PE cycles have occurred. The PE cycle degrade the cells, resulting in an increased number of bit errors due at least in part to the formation of interfacial charge traps and oxides that form at the floating gate as discussed above. Degradation from PE cycle wear out results in increased BER associated with each state/symbol in a group of memory cells. The degradation may cause the central values of the cell voltage distributions 110, 112, 113, 114 of the used cells (cells that have experienced a number of PE cycles) to differ shift slightly from the central values of the distributions 101, 102, 103, 104 when the cells were new. Additionally or alternatively, the cell voltage distributions 110, 112, 113, 114 of the used cells may spread out as they age, eventually overlapping the distributions of neighboring states/symbols and encroaching on the threshold voltage boundaries VT1, VT2, VT3, VT4.

As shown in FIG. 2, some of the distributions for a group in a two-bit device may spread beyond the threshold voltage boundaries while others may not. As the central voltages of the distributions shift and/or the distributions widen, the group of memory cells may not be able to reliably store data, and a read error may occur. The device may have additional safeguards to deal with such a read error, e.g., using error correction codes (ECC). However, should the errors be great enough, e.g., extending over a number of cells in the same word, then the system may find the read error unrecoverable.

In some applications, occasional read errors may be acceptable due to the nature of the stored data. For example, streaming audio and video can lose small portions of data without significantly impacting the quality of the rendered media. In other applications, such as enterprise data storage, customers may specify strict requirements on unrecoverable error rates. In such applications, even a single unrecoverable event can cause a warranty return and so it is worth taking additional recovery steps over and above what is provided for in the flash memory packages provided by vendors.

Figure 3:
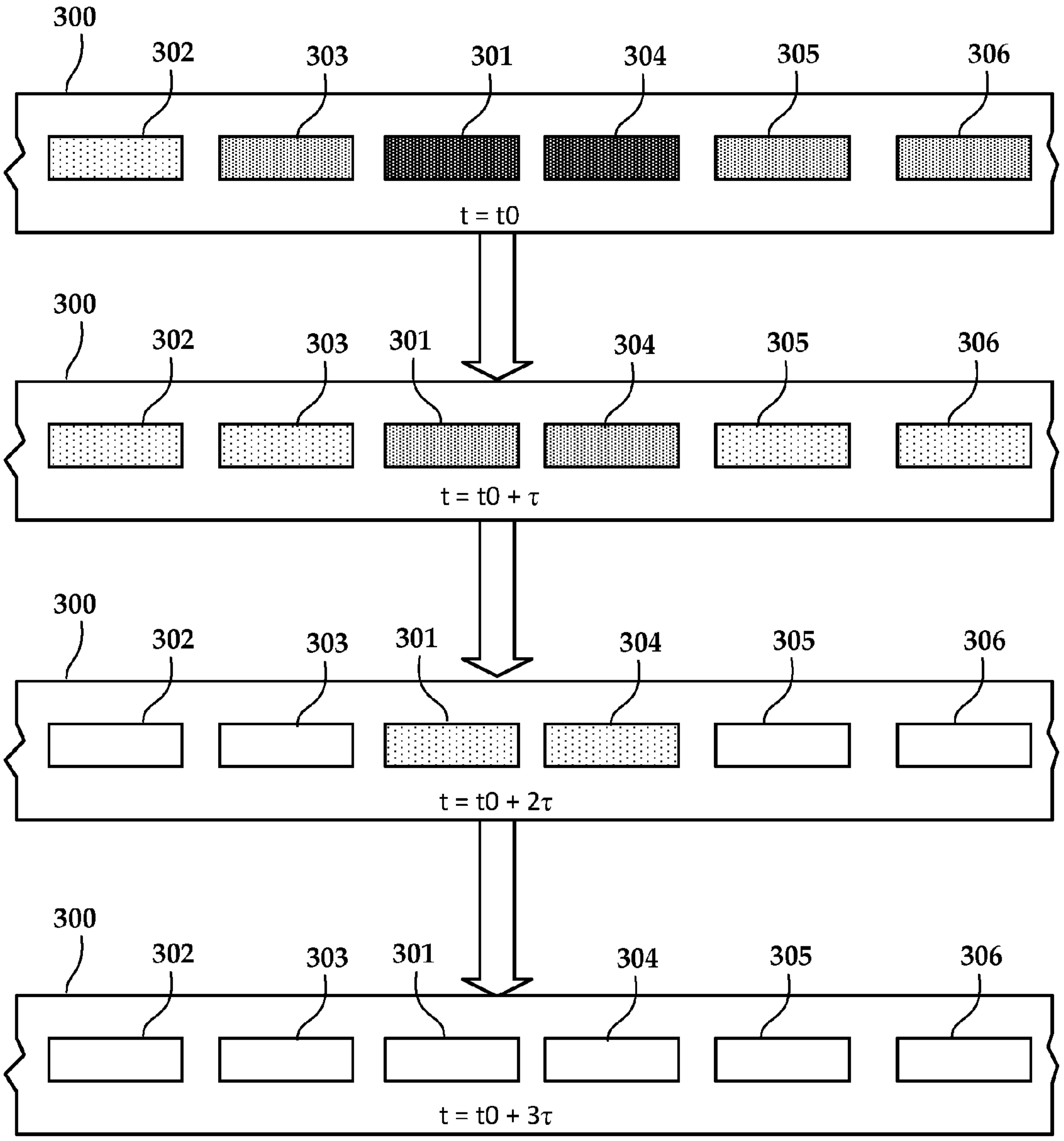
FIGS. 3 and 4 are block diagrams a block diagram illustrating a recovery procedures according to example embodiments.

In the present disclosure, methods and apparatuses are described that can perform additional read recovery operations that extends beyond features within the flash memory package exposed by the flash memory vendors or external ECC. These additional steps are memory and controller hardware independent and not reliant on a vendor exposing internal commands. In FIG. 3, a block diagram illustrates a recovery procedure according to a first example embodiment. For this example, an array of memory units 301-306 are mounted on a common substrate 300 and are neighbors, meaning they are in physical proximity to one another on the substrate 300. For this example, the memory units 301-306 are described NAND flash memory pages, although the example may be applicable to other memory unit sizes (e.g., erase blocks, words) and other types of memory (e.g., NOR flash memory, resistive-type memory).

As indicated at time t0, the memory units 301-306 are at different temperatures, a darker shading indicating a higher temperature. It is not a necessary condition that all memory units 301-306 be at different temperatures, only that a high temperature is affecting one of the units. In particular, memory unit 301 is at a high temperature such that the memory unit 301 is unreadable during a read operation. For this type of read error, it is determined that lowering the temperature of memory unit 301 may help recover data stored in the memory unit 301.

Upon determining the unrecoverable read, access to the surrounding/neighboring memory units 302-306 is restricted, e.g., by delaying further read and write operations targeted to the memory units 302-306. As indicated by the passage of time by increments τ, this allows the memory units 301-306 to cool. All of the memory units 301-306 are at a uniform temperature at time t0+3τ. At this time, access to the target memory unit 301 may be attempted, as well as possibly allowing access to surrounding units 302-306. Note that the memory units 302-306 are shown surrounding the target memory unit 301 left to right, but in practice may surround the memory unit 301 in any direction and dimension.

While the memory units 301-306 are cooling but still at different temperatures, e.g., at times t0+τ and t0+2τ, access to the target memory unit 301 may also be restricted until a predetermined amount of time has passed. In other embodiments, the target memory unit 301 may be read during this intermediate time when the memory units are cooling. While this may extend the time for full cooling (e.g., assuming the read operations raise temperature of the target memory unit 301), if successful, may reduce the time that access to the other memory units 302-306 is limited.

It will be understood that the example in FIG. 3 may be applicable to other neighboring devices not sharing a substrate (e.g., proximate die, proximate packages, proximate circuits that are not memory units, etc.). In such a case, the target memory unit 301 may be part of a memory storage package, and units 302-306 may be electronic devices proximate to the target memory unit. In such a case, controlling access to the neighboring units may involve other types of control instead of or in addition to reading, writing and erasing. For example, devices can be made to go into low power modes, test modes, etc., that can lower or raise temperatures as desired.

Figure 4:
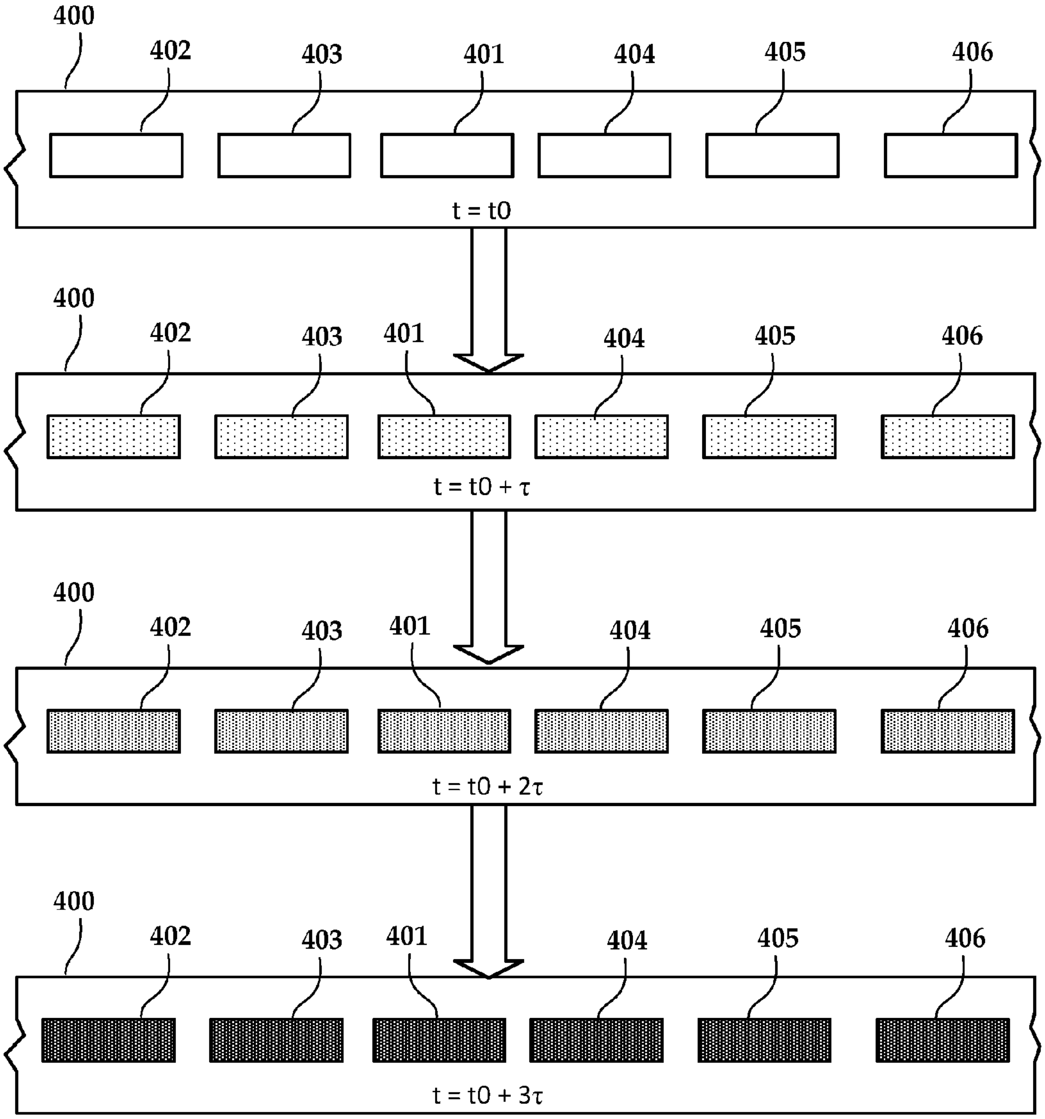

In FIG. 4, a block diagram illustrates a recovery procedure according to a first example embodiment. Similar to the previous example, an array of memory units 401-406 (e.g., NAND flash memory pages) are mounted on a common substrate 400. As indicated at time t0, the memory units 401-406 are at the same temperature, although this is not a necessary condition for this procedure. As with FIG. 3, a darker shading indicating a higher temperature. In this example, memory unit 401 is at a low temperature such that the memory unit 401 is unreadable during a read operation. For this type of read error, it is determined that raising the temperature of memory unit 401 may help recover data stored in the memory unit 401.

Upon determining the unrecoverable read, access to the surrounding/neighboring memory units 402-406 is increased, e.g., by reading, writing to, or erasing the memory units 402-406. This increased operation may simulate a host command, such that the operations can be executed without special operations being available for the data storage chip. Writing and erasing take longer amounts of time than reading although may cause relatively more heating, however may only be an option for any units that are not currently storing user data. Alternatively, if repeated erasure/writing is desired, data from the neighboring units 402-406 can be stored in a buffer (e.g., RAM or another persistent storage location) and then repeatedly be rewritten.

As indicated by the passage of time by time increment τ, the forced additional access operations cause the memory units 401-406 to heat up. All of the memory units 401-406 are at an increased temperature at time t0+3τ. At this time, access to the target memory unit 401 may be attempted. Note that the memory units 402-406 are shown surrounding the target memory unit 401 left to right, but in practice may surround the memory unit 401 in any direction and dimension.

At intermediate times when the memory units 401-406 are being accessed to raise the surrounding temperature, e.g., at times t0+τ and t0+2τ, reading of the target memory unit 401 may also be performed. This will have the effect of raising temperature of the memory unit 401, as well as determining if and when the memory unit 401 becomes recoverable. If successful, the repeated accesses to surrounding units 402-406 may cease and normal operation can continue.

It will be understood that the embodiments shown in FIGS. 3 and 4 may be chosen based on a number of factors. For example, if it is possible to determine the type of error that occurred (e.g., direction of shifting as in FIG. 2), then one of the cooling or heating procedures as shown respectively in FIG. 3 or 4 may be more likely to make the memory unit recoverable. For example, if the temperature in the enclosure is high, restricting access to cool the hardware could be the action most likely to correct the error. Other factors that may be taken into account when choosing remedial options include other ambient conditions (e.g., humidity, vibration), age of the affected cells, type of storage media (e.g., magnetic disk, NAND/NOR flash, resistive memory, DRAM), etc.

Figure 5:
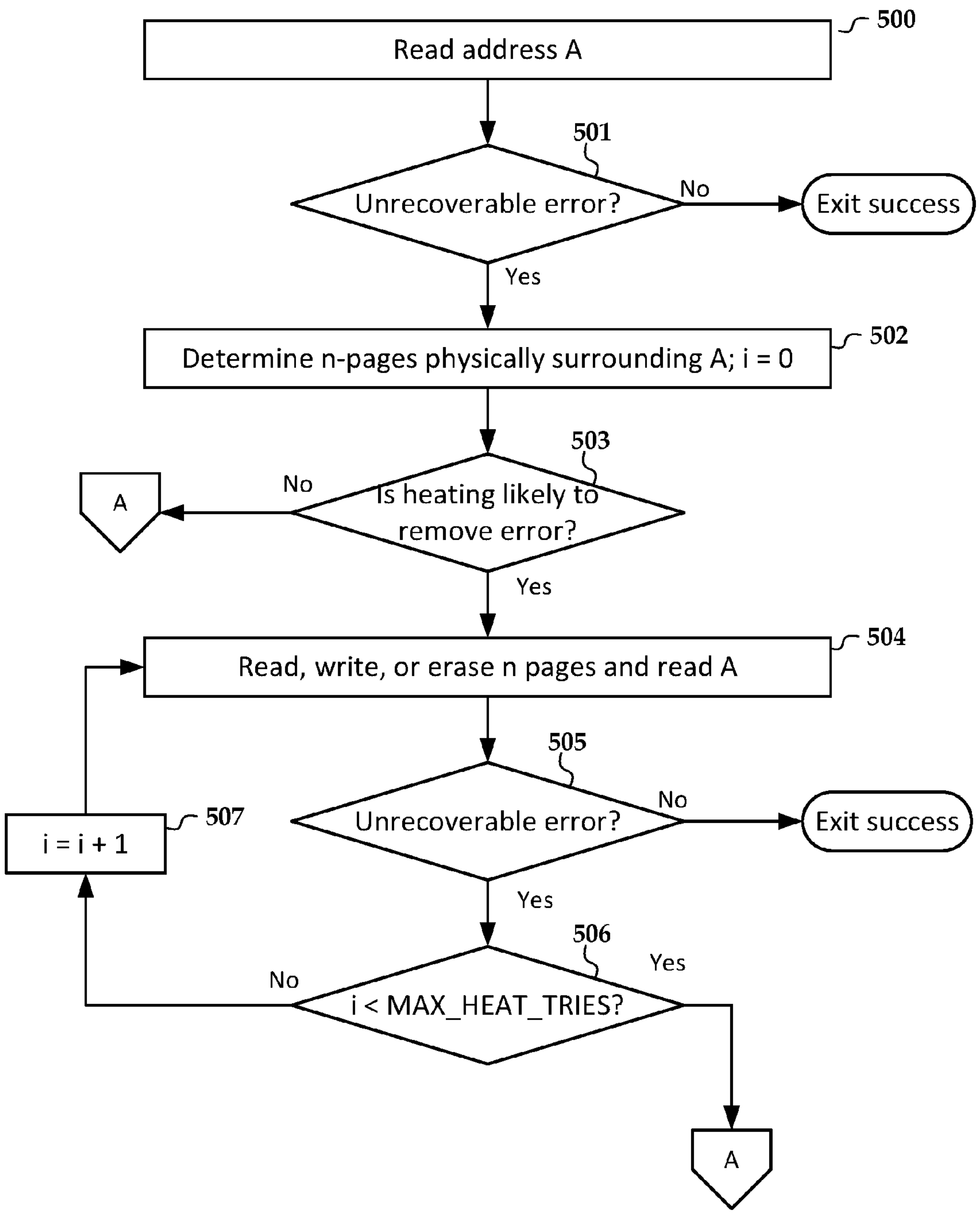
FIGS. 5 and 6 are flowcharts showing a method according to an example embodiment.
Figure 6:
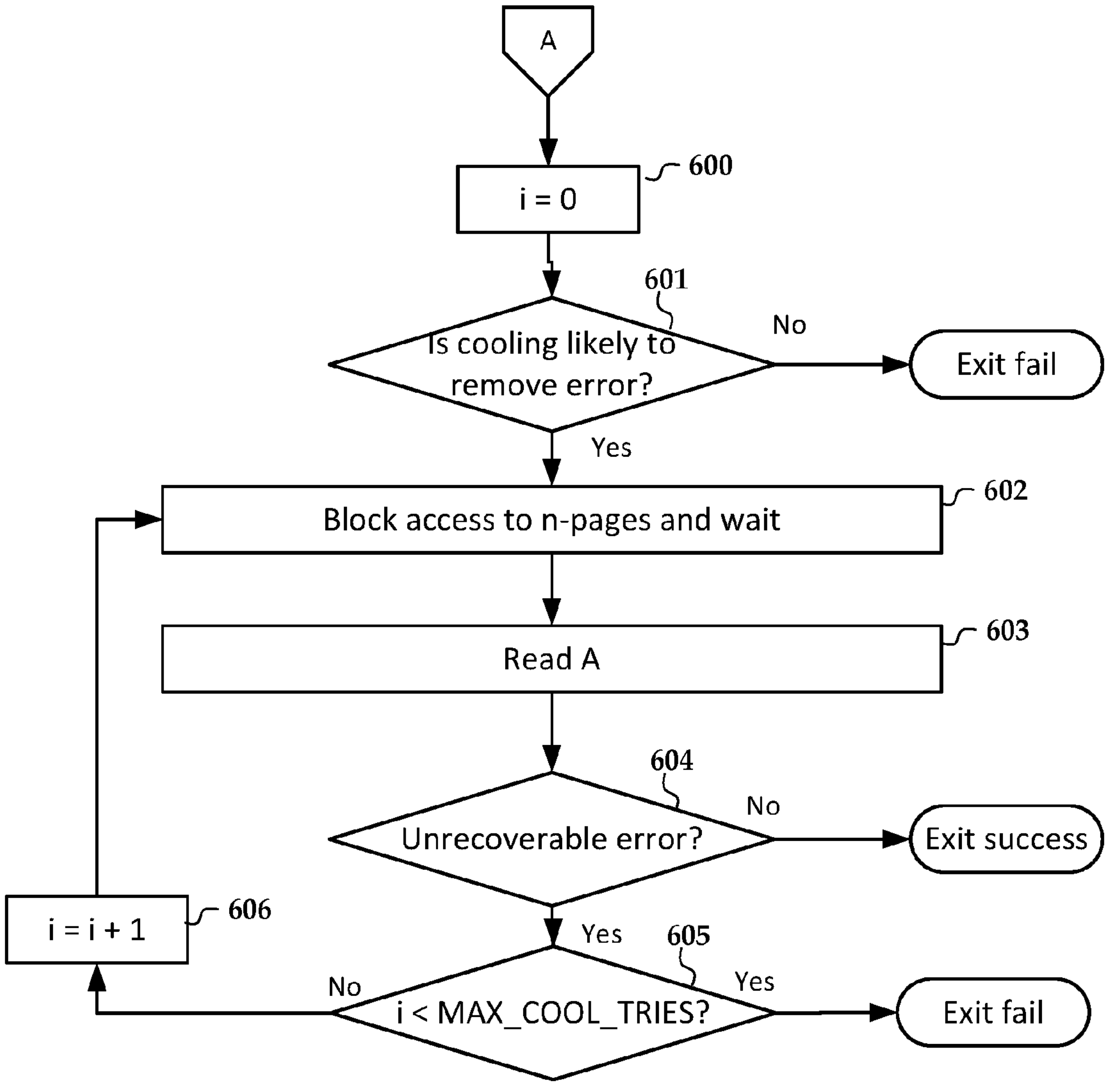

In FIGS. 5 and 6, flowcharts show a method according to an example embodiment. This method can utilize specific examples of the embodiments shown in FIGS. 3 and 4. An address A is read at block 500, and if determination at block 501 is that a read error occurs, the n-pages that physically surround/neighbor the target address is found at block 502. Knowledge of hardware geometry could be applied to target the activity at locations in close proximity to the area in error. For example, a spatial database could be formed that provides results based on physical proximity to a physical address of the page at address A. At block 502, a counter is also set to zero.

At block 503, a check is made to see if heating is likely to remove the error. If so, access is forced for the n-pages (e.g., read, write, or erase) and also the target page at address A is also read. If the reading of address A is successful as determined at block 505, then the procedure exits successfully. If not, then the counter is incremented at block 507 and the loop continues until the counter reaches a limit as determined at block 506. If this does not result in a success, the procedure continues to the flowchart shown in FIG. 6.

At the beginning of the flowchart in FIG. 6, the counter is reset to zero at block 600. At block 601, a check is made to determine whether cooling the targeted page is likely to remove the error. Note that the checks at blocks 601 and 503 need not be mutually exclusive. For example, in some cases it may be desirable to first heat the affected region then cool the affected region or vice versa. Assuming block 601 returns affirmative, the access is blocked to the surrounding n-pages that surround the target page and a wait is performed at block 602. After the wait, the address A is read again at block 603 and error determined at block 604. This is repeated by incrementing the counter at block 606 and checking at block 605 that the counter does not exceed a value.

There may be many variations on the procedures shown in FIGS. 5 and 6. For example, the same or similar procedures could be used in response to a write or erase error instead of or in addition to a read error. The target address and surrounding regions were referred to as flash memory pages, but other memory units may be used (e.g., erase blocks, sectors). A counter is used to put a limit on the heating or cooling cycles, but other criteria instead of or in addition to a counter may be used. For example, a temperature measurement from the memory chip may be used. In the example heating and cooling cycles 504-507 and 602-606, a read of the target address A is attempted during each cycle to determine if there still is an unrecoverable error. In other embodiments, the cycles may proceed for a number of times without a read in order to speed up the process.

In addition to the steps described above, memory locations that are more susceptible to data loss due to thermal effects could be saved elsewhere prior to executing the recovery steps. This may include copying data from surrounding/neighboring memory units that have not yet failed but may have similar thermal profiles as the targeted memory unit. For example, for NAND flash memory, the upper page data could be saved and combined with the lower page data from the recovery step prior to attempting error correction. The data from the neighboring locations may be copied to a safe location, (e.g., a location with fewer write-erase cycles or a temporary memory buffer) and the neighboring address locations can rewritten with the same or different data if the goal is heating. If the goal is cooling, the logical addresses of the copied data may be remapped to the new physical addresses so that the data can be accessed during the recovery process while blocking internal access to the original locations to facilitate, e.g., to preventing garbage collection or other internally-initiated operations.

Figure 7:
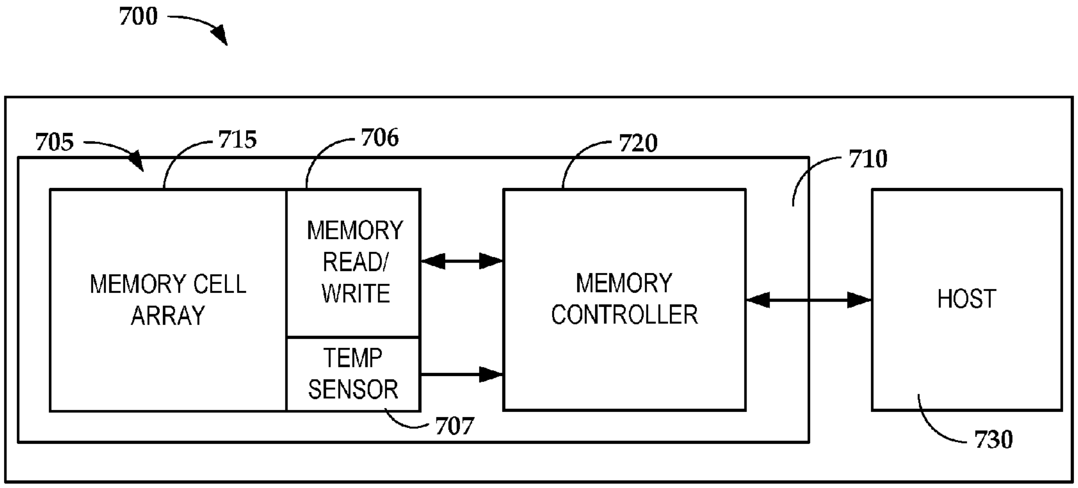
FIGS. 7 and 8 are block diagrams of an apparatus according to an example embodiment.

The block diagram of FIG. 7 shows a memory system 700 according to an example embodiment. The memory system 700 is capable of implementing processes that provide for recovery of memory units as described above. The system 700 includes a memory device 710 capable of being coupled for communication with a host processor 730. The memory device 710 includes a solid-state, non-volatile memory 705 and a memory controller 720 that is in communication with the host 730. The memory 705 includes an array of memory cells 715 and read/write circuitry 706. The read/write circuitry 706 is configured to generate signals that cause data received from the memory controller 720 to be stored into the memory cells. The read/write circuitry 706 includes circuitry configured to read the voltage of the memory cells in the memory cell array. In some implementations, the memory cell array 715 also have a temperature sensor 707 for measuring temperature of the memory cell array 715 and/or monitoring the temperature history of the memory cell array 715.

The block diagram of FIG. 7 and other block diagrams discussed herein show system components divided into functional blocks. It will be appreciated by those skilled in the art that there exist many possible configurations in which these functional blocks can be arranged and implemented. The examples depicted herein provide some possible functional arrangements for system components. Alternatively, some implementations may encompass all or a portion of the functionality of the memory controller 720 included within the host 730. Other implementations may encompass the read/write element 706 included with the functions of the controller 720. In still another example, the various approaches described herein may be implemented using hardware, software, or a combination of hardware and software. Memory chips, controller chips, application-specific integrated circuits (ASICs), and/or host computers may contain one or more of the functional elements discussed herein.

Figure 8:
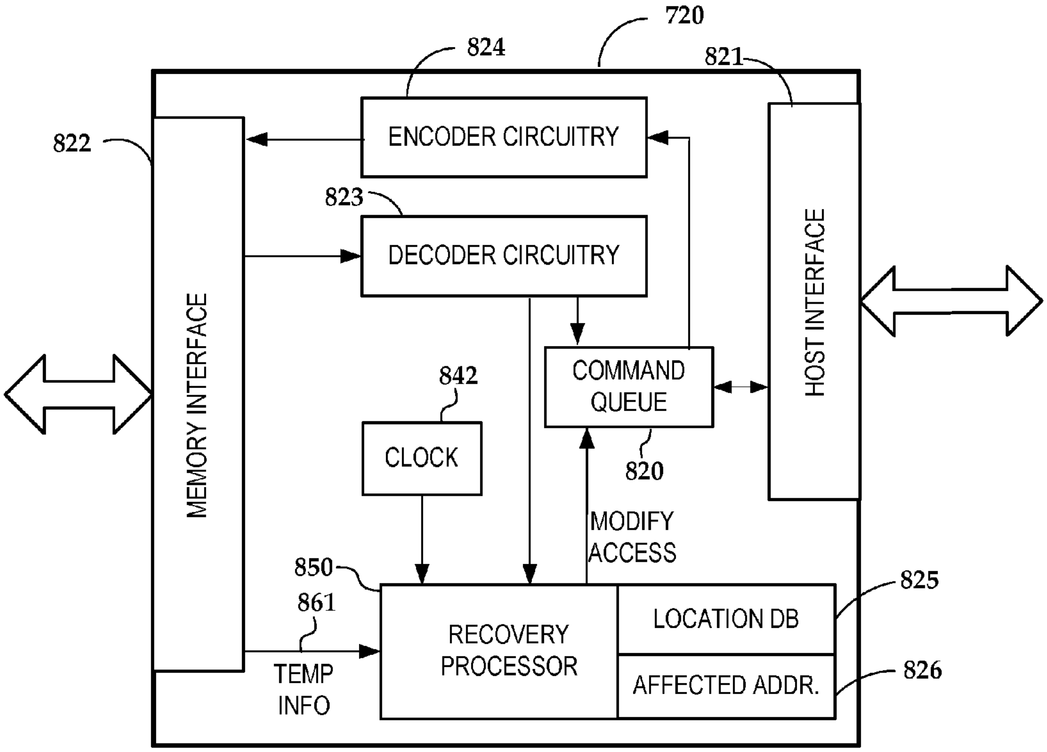

The block diagram of FIG. 8 provides a more detailed view of the memory controller 420 of the embodiment shown in FIG. 7. Memory controller 420 includes a recovery processor 850 configured to perform additional recovery operations in response to an unrecoverable storage error. A location database 825 identifies groups of memory cells that are physically proximate a target cell in accordance with embodiments discussed herein. The recovery processor 850 uses the location database 825 to identify a group of addresses to which access is modified, e.g., access is stopped or forced. The recovery processor 850 maintains a list 826 of affected addresses and the type of access modification being performed.

The memory controller 720 further includes a host interface 821, a memory interface 822, encoder circuitry 824, and decoder circuitry 823. The memory interface 822 serves to permit the memory controller 720 to communicate with the memory 805. The host interface 821 serves to permit communication between the host 830 and the memory controller 720. The host interface 821 sends and receives data via a command queue 820 that processes host command (e.g., load, store, verify). The command queue 820 passes data that is to be written into storage to the encoder circuitry 826 which operates to encode the data using an error correcting code (ECC). When a memory write command is implemented, encoded data is transferred through the memory interface 822 to the memory read/write element 806. The memory read write element 806 generates signals that cause the encoded data to be stored in the memory array 815.

When a read command is implemented, the memory read/write circuitry senses the analog voltages present in the memory cells and converts the sensed analog voltages to digital values by comparing the analog voltages to one or more threshold voltage references. The digital data is transferred from the memory 805 to the controller 720 via the memory interface 822. The digital data is decoded by the decoder circuitry 823 and the decoded data is transferred to the host through the host interface 821 via the command queue 820. The decoder circuitry 823 uses the ECC to identify errors in the data and can determine the BER of the memory cells based on the identified errors.

As noted above, the recovery processor 850 can modify access to a range of affected addresses 826, either by pausing accesses (e.g., read/writes) directed to the addresses or causing additional commands that are not host-requested to be performed on the addresses. As shown, this is implemented via the command queue 820, which handles the commands and data from the host and return status and data to the host. The command queue may be able to handle multiple streams of commands and internally manage priority of the queued commands.

When a command (e.g., read or write) returns an unrecoverable error, the recovery processor 850 detects this and delays return of the command status to the host until recovery can be attempted. The recovery is performed on a range of targeted addressed determined from the location database 825. If recovery involves limiting access to a range of addresses to cool the surrounding area, the recovery processor 850 can hold/delay the processing any other commands in the queue affecting the address range. If the recovery involves forcing non-host-requested accesses (e.g., read) to heat the surrounding area, the recovery processor 850 can insert commands on the queue 820 to simulate host requests in order to execute those commands, as well as blocking any host-requested operations at those addresses until the process is complete. The recovery processor 850 can internally manage return status and states of these internally-generated commands.

Although the recovery processor 850 is described as monitoring unrecoverable errors due to host commands, the recovery processor 850 may provide similar functionality in response to internally generating commands. For example, a solid-state storage device may regularly initiate internal procedures such as wear-leveling and garbage collection. These procedures may involve moving blocks of data to different memory locations and remapping the logical-to-physical relationships used to find a physical address in response to a logical address used in a host command. These internal procedures may involve reading and writing to memory units, and the recovery processor 850 may handle these procedures similarly to host commands, except there is no need to delay return of command status to the host when performing the recovery.

Figure 9:
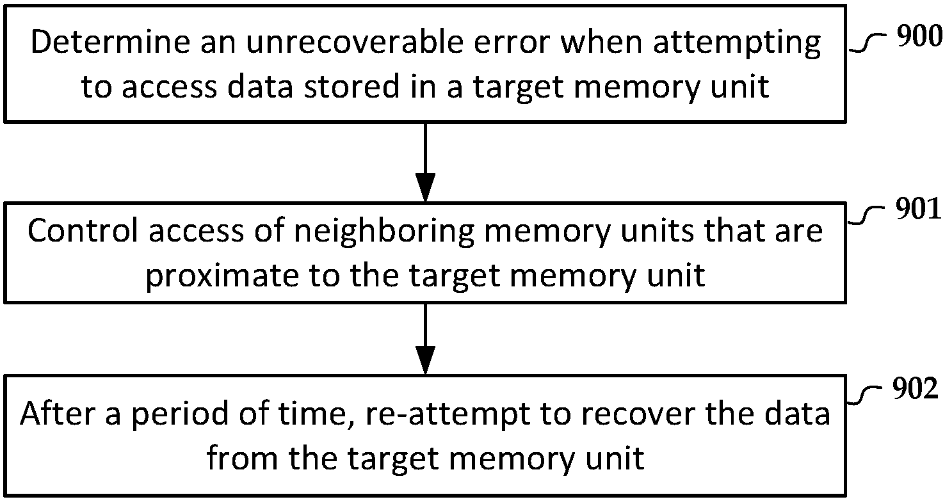
FIG. 9 is a flowchart of a method according to another example embodiment.

In FIG. 9, a flowchart shows a method according to an example embodiment. The method involves determining 900 an unrecoverable error when attempting to access data stored a target memory unit of data storage medium of a data storage device. The data storage medium may be volatile or non-volatile. Access of neighboring memory units that are proximate to the target memory unit is controlled 901. The controlling of the access affects a temperature of the target memory unit over a period of time. After the period of time, recovery of the data from the target memory unit is re-attempted 902.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A method, comprising:

determining an unrecoverable error when attempting to access data stored in a target memory unit of a storage medium of a data storage device;

controlling access to neighboring devices that are proximate to the target memory unit, the controlling of the access affecting a temperature of the target memory unit over a period of time; and after the period of time, re-attempting to access the data from the target memory unit.

2. The method of claim 1, wherein controlling the access to the neighboring devices comprises reading from neighboring memory units and results in an increase in the temperature of the target memory unit.

3. The method of claim 1, wherein controlling the access to the neighboring devices comprises writing to neighboring memory units and results in an increase in the temperature of the target memory unit.

4. The method of claim 3, wherein writing to the neighboring memory units comprises:

reading neighboring data currently in the neighboring memory units;

storing the neighboring data in a buffer;

erasing the neighboring memory units; and re-writing the neighboring data to the neighboring memory units.

5. The method of claim 1, wherein controlling the access to the neighboring devices comprising preventing reads from or writes to neighboring memory units to decrease the temperature of the target memory unit.

6. The method of claim 1, wherein attempting to access the data comprises attempting to read the data.

7. The method of claim 1, further comprising, before controlling access to the neighboring devices:

reading neighboring data currently in neighboring memory units; and storing the neighboring data in another location on the storage medium.

8. The method of claim 1, further comprising determining neighboring devices units via a spatial database.

9. The method of claim 1, wherein the target memory unit and the neighboring devices comprise pages of flash memory.

10. A data storage device comprising:

a memory interface circuit configured to communicate with a solid-state, non-volatile data storage medium;

a controller coupled to the memory interface and configured to:

determine an unrecoverable error when attempting to access data stored on a target memory unit of the solid-state, non-volatile storage medium; and control access to neighboring memory units that are proximate to the target memory unit, the controlling of the access affecting a temperature of the target memory unit over a period of time; and after the period of time, re-attempt to access the data from the target memory unit.

11. The data storage device of claim 10, wherein controlling the access to the neighboring memory units comprising reading from the neighboring memory units and results in an increase in the temperature of the target memory unit.

12. The data storage device of claim 10, wherein controlling the access to the neighboring memory units comprises writing to the neighboring memory units and results in an increase in the temperature of the target memory unit.

13. The data storage device of claim 12, wherein writing to the neighboring memory units comprises:

reading neighboring data currently in the neighboring memory units;

storing the neighboring data in a buffer;

erasing the neighboring memory units; and re-writing the neighboring data to the neighboring memory units.

14. The data storage device of claim 10, wherein controlling the access to the neighboring memory units comprises preventing reads, writes, or erases affecting the neighboring memory units to decrease the temperature of the target memory unit.

15. The data storage device of claim 10, wherein attempting to access the data comprises attempting to read the data.

16. The data storage device of claim 10, wherein the controller is further configured to, before controlling access to the neighboring memory units:

read neighboring data currently in the neighboring memory units; and store the neighboring data in another location on the solid-state, non-volatile storage medium.

17. The data storage device of claim 10, wherein the controller is further configured to determine the neighboring memory units via a spatial database.

18. The data storage device of claim 10, wherein the target memory unit and the neighboring memory unit comprise pages of flash memory.

19. A data storage device comprising:

a flash memory array;

a memory interface circuit configured to communicate with the flash memory array;

a host interface configured to communicate with a host;

a controller coupled to the memory interface and the host interface, the controller configured to:

determine an unrecoverable error when attempting, in response to a command from the host, to access data stored in a target page of the flash memory array; and control access to neighboring pages that are proximate to the target page, the controlling of the access affecting a temperature of the target page over a period of time; and after the period of time, re-attempt to access the data from the target page.

20. The data storage device of claim 19, wherein the controller is further configured to delay responding to the command from the host until after re-attempting to access the data.

* * * * *